United States Patent [19]
Bryson et al.

[11] Patent Number: 5,357,211
[45] Date of Patent: Oct. 18, 1994

[54] PIN DRIVER AMPLIFIER

[75] Inventors: Stephen W. Bryson; Alan T. Kondo, both of Cupertino; Don N. Lee, San Jose, all of Calif.

[73] Assignee: Raytheon Company, Lexington, Mass.

[21] Appl. No.: 56,093

[22] Filed: May 3, 1993

[51] Int. Cl.$^5$ ............................................. H03F 3/26
[52] U.S. Cl. .................................... 330/263; 307/270
[58] Field of Search ................ 324/158 R; 307/268, 307/270; 330/2, 263, 118, 120, 122, 264

[56] References Cited

U.S. PATENT DOCUMENTS 5,140,159  9/1992  Lau et al. ........................ 324/158 R
5,144,157  9/1992  Russell et al. ...................... 307/270

*Primary Examiner*—Steven Mottola
*Attorney, Agent, or Firm*—William R. Clark

[57] ABSTRACT

A pin driver amplifier having a complementary pair of transistors with a pair of resistors coupled between the respective emitters. A node between the resistors is coupled through an output series resistor to an output terminal adapted for connection of a transmission line that conducts driver pulses of predetermined voltage levels and timing to a device under test. A capacitor is tied between the emitters to provide a substantially constant reverse termination impedance for the transmission line thereby reducing reflections. Also, an RC network is coupled between the output terminal and ground to further reduce reflections. The amplifier transistors are driven by respective buffer transistor emitters that are tied together by a capacitor to make the positive and negative going drive capabilities for the amplifier transistors more equal. Further, capacitors are coupled between the amplifier collectors and ground to provide a bypass for parasitic inductance in the supply voltage wires.

20 Claims, 2 Drawing Sheets

PIN DRIVER AMPLIFIER

BACKGROUND OF THE INVENTION

The field of the invention generally relates to test equipment pin drivers that produce driver pulses to test a device under test, and more particularly relates to apparatus and method for enhancing driver pulse parameters including pulse reflections, switching speed, and ringing.

As is well known, the role of a pin driver in typical automatic test equipment (ATE) systems is to send driver pulses having the correct voltages and timing to a device under test (DUT). A prototype pin driver was built to include a pulse forming section, a buffer, and an amplifier connected in series. The pulse forming section received a data input and, in response thereto, provided output pulses timed in accordance with the data input. The amplifier required a significant amount of input bias current, so an intermediate buffer was used to make the operation of the pulse forming section independent of the test device load. The amplifier included npn and pnp emitter follower transistors with the emitters being coupled together through two emitter resistors connected in series. The output of the amplifier was coupled from a node between the two emitter resistors though an output series resistor.

The use of an output series resistor is the generally accepted method of terminating ATE systems, and is referred to as series termination. That is, a pin driver is generally coupled to the pin of the device under test using a transmission line such as coaxial cable or microstrip line, and the line is terminated with a series resistor at the sending end. If the sum of series resistor value and the pin driver output impedance exactly equals the transmission line impedance, no reflections are generated. For this ideal condition, the pulse at the device under test would be a faithful replica of the pin driver output except for a delay time of approximately 1.6 nanoseconds per foot for a 50 ohm transmission line. Ideally, the output amplifier impedance would be zero, in which case the series resistor would be 50 ohms for a 50 ohm transmission line. In practice, however, output amplifier impedances are 7 ohms or larger, so output series resistors may generally be 43 ohms or less.

One problem with the above described prototype pin driver was that the pin driver output impedance increased during the leading and trailing edges of output driver pulses. That is, the output amplifier impedance did not stay constant at 7 ohms, or any other value. As a result, the sum of the series resistor value and the pin driver output impedance did not stay exactly equal to the 50 ohm transmission line, so the pulse waveform was distorted by reflections.

In the above described prototype pin driver, the bases of the respective amplifier emitter follower transistors were driven by respective npn and pnp emitter follower transistors in the buffer, and each buffer transistor emitter had a current source connected thereto. Turn on base currents for the amplifier transistors were respectively provided by the two buffer current sources. Turn off base currents for the amplifier transistors were respectively provided by the buffer transistors. A problem with this arrangement was that the pnp buffer transistor had better drive capability for negative going transitions than for positive, and the npn transistor had better drive capability for positive going transitions than for negative. Consequently, the amplifier transistors were not receiving equal input drive signals for both positive and negative going transitions. That is, one amplifier transistor was driven harder for positive going transitions and the other was driven harder for negative going transitions. The net result was that the switching speed of the output amplifier was not as fast as it could be.

Another problem was that in a typical packaged integrated circuit, the supply voltages $V_{CC}$ and $V_{EE}$ are brought to the integrated circuit using bonding wires. The series inductance presented by these wires could be as high as 4 nanohenries. For high current circuits such as pin drivers, inductances on this order could cause the driver pulses to have higher overshoot and slower rise times.

SUMMARY OF THE INVENTION

In accordance with the invention, a pin driver which is adapted for transmitting driver pulses of predetermined voltage levels and timing to a device under test includes an output amplifier comprising a complementary pair of transistors with a pair of resistors coupled in series between corresponding terminals of the transistors. For example, the corresponding pair of terminals may be the respective emitters, and the transistors may be configured as emitter followers. An output terminal is adapted for connecting a transmission line such as a coaxial cable that leads to the device under test, and an output resistor is coupled between the output terminal and a node between the pair of series resistors connected between the corresponding terminals of the transistors. The amplifier further comprises means for maintaining a substantially constant reverse termination impedance for the transmission line notwithstanding changes in output impedance at the corresponding terminals of the complementary pair of transistors. Preferably, the maintaining means comprises a capacitor coupled between the corresponding terminals of the complementary pair of transistors. The amplifier may also preferably comprise a resistor and capacitor connected in series between the output terminal and ground.

With such arrangement, approximately the same voltage appears at the corresponding transistor terminals during transitions of said driver pulses, so the pair of resistors substantially appear to be in parallel regardless of the states of the transistors. Therefore, the transition variances in output impedance at the node between the resistors are greatly reduced by the addition of the capacitor across the resistors. Also, the resistor and capacitor in series to ground at the sending end of the transmission line further serves to maintain a substantially constant reverse termination impedance on the transmission line. As a result, the amplifier output impedance is better matched to the transmission line, and reflections are minimized.

The invention may also be practiced by a pin driver comprising pulse forming means responsive to a data input signal for providing a pulsed output of predetermined voltage levels and timing in accordance with the data input signal and a buffer circuit comprising a pair of buffer transistors each having a base responsive to the pulsed output of the pulse forming means wherein the buffer circuit further comprises a pair of current sources each coupled to a respective one of corresponding terminals of the buffer transistors. The driver also includes an amplifier circuit comprising a complementary pair of transistors each having a base responsive to a respective one of the corresponding terminals of the buffer transistors wherein a pair of resistors are connected in series between corresponding terminals of the amplifier transistors. An output terminal is adapted for connecting a transmission line to transmit output driver pulses to a device under test, and an output series resistor is coupled between the output terminal and a node between the pair of series resistors. In accordance with this feature of the invention, a capacitor is coupled between the corresponding terminals of the buffer transistors. Therefore, in the typical arrangement where one of the buffer transistor is an npn type and the other is a pnp type, and the amplifier bases are driven by emitters of the buffer transistors, more equal drive capability is provided for negative going versus positive going pulse transitions. In accordance with another feature of the invention, capacitors are coupled between each one of second corresponding terminals of the amplifier transistors and ground. These capacitors act as bypass capacitors for parasitic inductances in the bonding wires providing supply voltages from off the integrated circuit. Therefore, improvement is attained in overshoot and slew rates.

BRIEF DESCRIPTION OF THE DRAWINGS

The foregoing objects and advantages will be more fully understood by reading the Description of the Preferred Embodiment with reference to the drawings wherein.

DESCRIPTION OF THE PREFERRED EMBODIMENT

Figure 1:
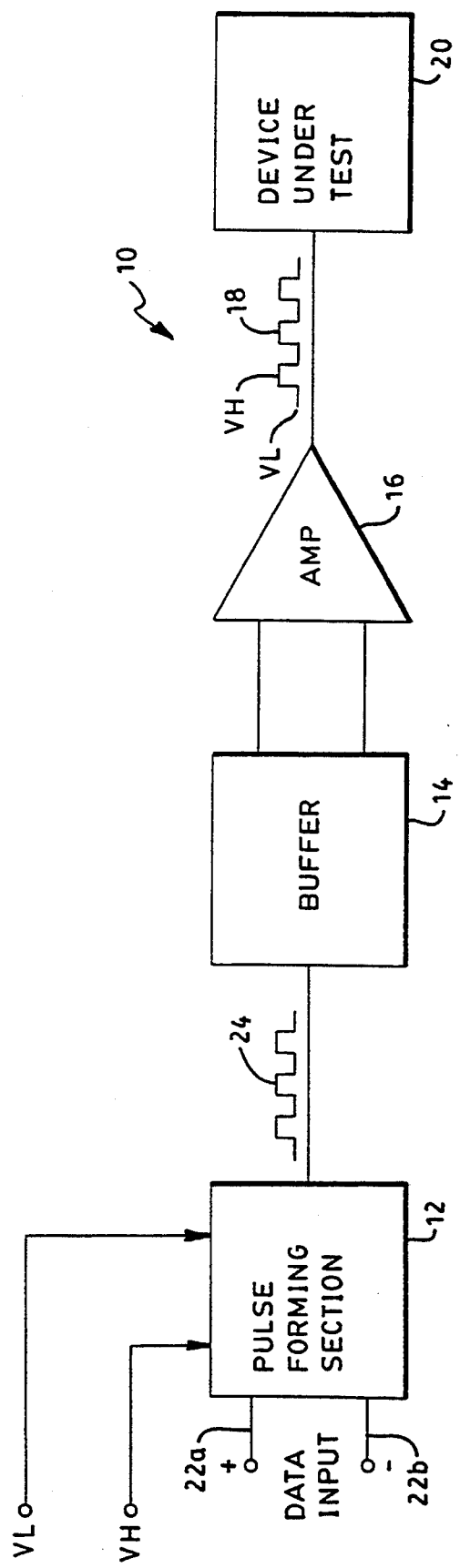
FIG. 1 is a block diagram of a pin driver.

In accordance with the invention, a pin driver 10 is adapted for transmitting driver pulses 18 of predetermined voltage levels and timing to a device under test 20. An output amplifier 16 includes a complementary pair of transistors 36 and 38 with a pair of series resistors 40 and 42 coupled between corresponding terminals, here emitters, thereof. An output terminal 41 is adapted for connecting a transmission line 60 such as a coaxial cable that leads to the device under test 20. An output resistor 52 is connected between the output terminal 41 and a node 48 between resistors 40 and 42. A capacitor 45 is coupled between the emitter of transistors 36 and 38, and thereby serves to maintain a substantially constant reverse termination impedance at output terminal 41 notwithstanding changes in output impedance at the emitters of transistors 36 and 38. Further, capacitor 56 and resistor 58 are connected in series from output terminal 41 to ground, and this also serves to maintain a substantially constant reverse termination impedance at the sending end of transmission line 60. Capacitor 34 is tied across the emitters of buffer transistors 26 and 28, and this serves to make the drive capability for negative and positive going transitions more equal. Also, in accordance with another feature of the invention, capacitors 70a and b are tied from the collectors of transistors 36 and 38 to ground to serve as bypass capacitors for parasitic inductances 68a and b during transitions.

Referring specifically to FIG. 1, a pin driver 10 includes a pulse forming section 12, a buffer 14 and an amplifier 16 that feeds driver pulses 18 of predetermined timing and voltage levels VH and VL to a device under test 20. More specifically, pulse forming section 12 is provided with a programmed data input on lines 22a and b, and reference voltage levels VL and VH corresponding to the respective desired low and high voltage levels of driver pulses 18. The data input signal has complementary states corresponding to the desired timing of driver pulses 18. In response thereto, pulse forming section 12 generates or forms output pulses 24 that are timed in accordance with the data input. That is, the delay, width, and period of the pulses 24 from pulse forming section 12 are determined by the timing of data input pulses on lines 22a and b. The high and low voltages of the pulses 24 are clamped in response to high and low programmed reference voltages VH and VL, and then pulses 24 are coupled to buffer 14. Buffer 14 functions to keep the parameters of output driver pulses 18 independent of the load. More specifically, amplifier 16 requires a significant amount of input bias current; therefore, without buffer 14, the slew rate of the pulse forming section 12 output signal would be dependent upon the loading on the output of amplifier 16. Complementary outputs of buffer 14 are coupled to amplifier 16 that provides the drive for driver pulses 18.

Figure 2:
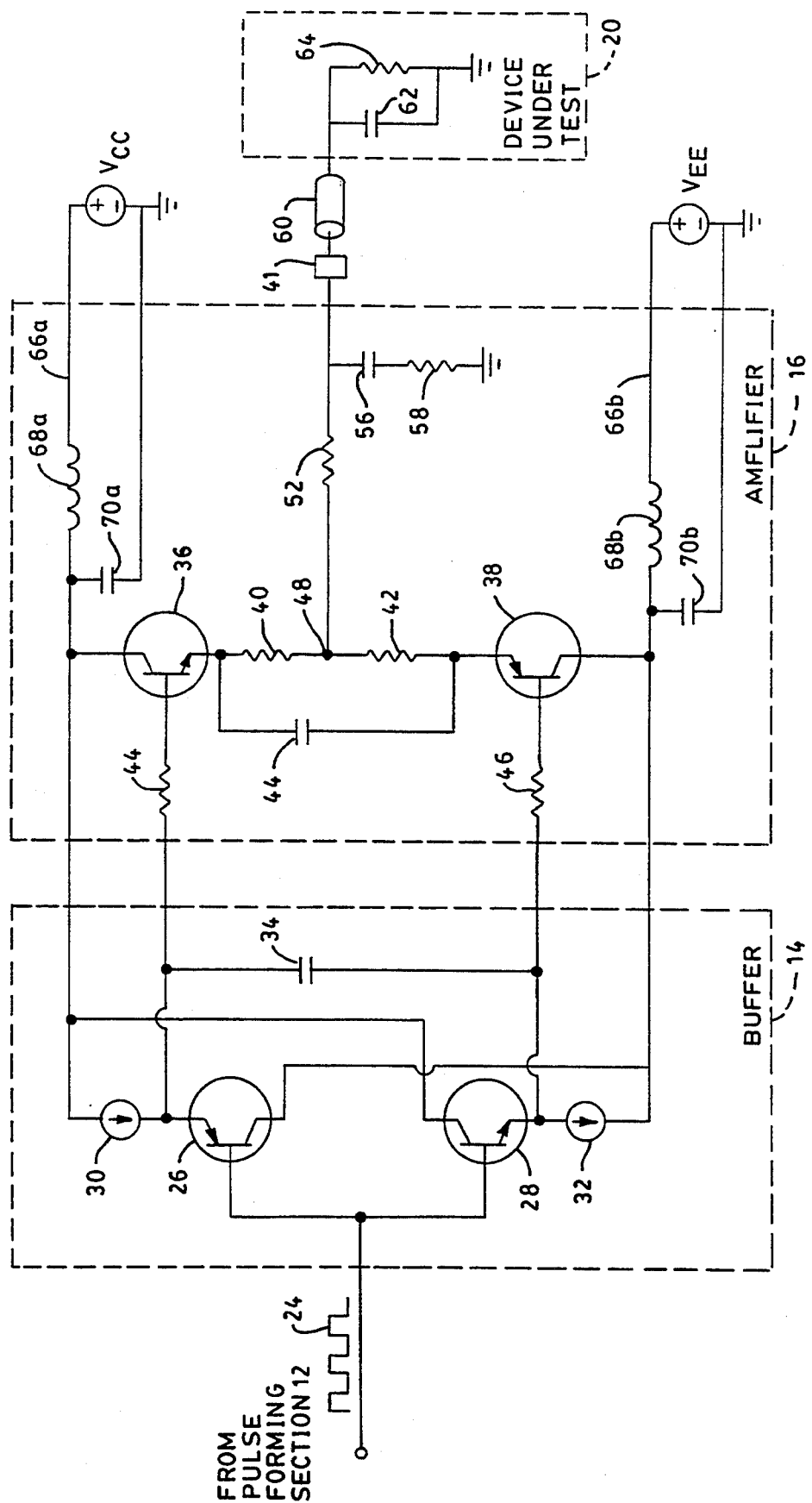
FIG. 2 is a simplified circuit for implementing the pin driver of FIG. 1.

Referring to FIG. 2, a simplified circuit implementation of buffer 14 and amplifier 16 is shown. In particular, the output pulses 24 from pulse forming section 12 are coupled to the bases of respective transistors 26 and 28. Transistor 26 is a pnp type having the emitter coupled through current source 30 to $V_{CC}$. The collector of transistor 26 is connected to $V_{EE}$. Transistor 28 is an npn type and the emitter is coupled through current source 32 to $V_{EE}$. The collector is coupled to $V_{CC}$. Capacitor 34 is connected between the respective emitters of transistors 26 and 28. Transistors 26 and 28 are thus connected as emitter followers that buffer amplifier 16 which includes transistors 36 and 38. In addition, transistors 26 and 28 also provide first order base emitter voltage compensation for transistors 36 and 38, respectively. As a result, the pulse signals progress from the pulse forming section 12 to the pin driver output terminal 41 with very little change in voltage levels, slew rates, and timing.

Amplifier 16 is a complementary emitter follower including transistors 36 and 38. Transistor 36 is an npn type. The collector is coupled to $V_{CC}$, and the emitter is coupled through a pair of series emitter resistors 40 and 42 to the emitter of transistor 38, which is a pnp type. Capacitor 45 is also connected between the emitters of transistors 36 and 38. The emitter of transistor 26 is connected through resistor 44 to the base of transistor 36, and the emitter of transistor 28 is connected through resistor 46 to the base of transistor 38. The collector of transistor 38 is coupled to $V_{EE}$.

The output for amplifier 16 is fed from a node 48 between resistors 40 and 42. Node 48 is coupled through output series resistor 52 to output terminal or connector 41. Connector 41 is coupled through capacitor 56 and resistor 58 to ground. Connector 41 is also coupled through transmission line 60 here depicted as coaxial cable to the device under test 20, here represented by capacitor 62 connected in parallel with resistor 64 to ground.

In a typical packaged integrated circuit, the supply voltages $V_{CC}$ and $V_{EE}$ are coupled to the integrated circuit using bonding wires 66a and b. The series inductance, here represented by inductors 68a and b, presented by these wires could be as high as four nanohenries. On chip capacitors 70a and b are connected across respective inductors 68a and b to ground, and act as bypass capacitors during the leading and trailing edges of the output pulse. Capacitors 70a and b serve to reduce overshoot when driving reactive loads, and also speed up the rise and fall times.

Amplifier 16 is a complementary emitter follower comprising transistors 36 and 38. In operation, turn on base currents for transistors 36 and 38 are provided by current sources 30 and 32, respectively. Turn off base currents for transistors 36 and 38 are provided by transistors 26 and 28, respectively. The quiescent emitter currents of transistors 36 and 38 are stabilized by resistors 40 and 42. The output impedance at node 48 in the quiescent state is equal to:

$$Z_{out} = \frac{(Q36re + R40)(Q38re + R42)}{(Q36re + R40) + (Q38re + R42)}$$

where Q36re and Q38re are the emitter output impedances for transistors 36 and 38, respectively, and R40 and R42 are the resistance values of resistors 40 and 42. For typical sizes of transistors 36 and 38 and resistance values for resistors 40 and 42, the quiescent output impedance may be approximately seven ohms. Therefore, to match the sum of output impedance at node 48 and series resistor 52 to the 50 ohm line here depicted as coaxial cable 60, resistor 52 would desirably have a value of 43 ohms to provide 50 ohms reverse termination for coaxial cable 60. Impedance matching to the transmission line minimizes reflections in driver pulses 18.

Unfortunately, with the prototype pin driver described in the Background of the Invention, the output impedance at node 48 increased during the leading and trailing edges of the output pulse thereby resulting in an impedance mismatch that produced reflections in driver pulses 18. A simplified analysis of the dynamics of the output impedance variations is as follows. During a positive edge of a pulse 24 from pulse forming section 12, the bases of transistors 36 and 38 are driven positive which causes transistor 38 to be turned off until its emitter voltage charges up to a new value. In particular, the positive edge turns off transistor 26 wherein current is supplied from current source 30 through resistor 44, transistor 36, resistor 40, and resistor 52 to the device under test 20 via transmission line 60. The positive edge turns on transistor 28 providing a path for sinking current to current source 32. A positive voltage is applied to the base of transistor 38 which turns off until its emitter voltage charges up. During this duration, the output impedance at node 48 is equal to the resistance of resistor 40 plus the output impedance Q36re of transistor 36. That is, the resistance of resistor 42 and the output impedance of Q38re of transistor 38 are out of the output impedance equation because no current is flowing in this path. Conversely, during the negative edge, the bases of transistors 36 and 38 are driven negative which results in transistor 36 being turned off. That is, the negative edge turns off transistor 28 and current source 32 sinks current from transistor 38 which is turned on. Also, transistor 26 is turned on providing a path for current from current source 30 as transistor 36 is turned off. In this case, the output impedance at node 48 is equal to the resistance of resistor 42 plus the output impedance Q38re of transistor 38. Resistor 40 and the output impedance Q36re are out of the equation. Therefore, assuming the values of resistors 40 and 42 to be approximately equal, the output impedance at node 48 increases by approximately one-half the value of resistor 40 during the leading and trailing edges of an output pulse. The increase in the driver output impedance caused the transmission line 60 to be mismatched, leading to reflections in the output driver pulse 18.

In order to reduce the change or variation in output impedance during transitional states, capacitor 45 was added to the circuit to tie the emitters of transistors 36 and 38 together. The value of capacitor 45 is made large enough so that resistors 40 and 42 remain substantially in parallel during the leading and trailing edges of an output pulse, notwithstanding either transistor 36 or 38 being turned off. That is, the emitter voltages of transistors 36 and 38 are substantially the same during transitions, so resistors 40 and 42 appear to remain parallel. Thus, capacitor 45 helps to reduce output reflections. A simulation of one typical embodiment showed that the addition of capacitor 44 of 10 picofarads reduced a reflection $V_R$ from approximately 109 to 58 millivolts peak-to-peak, a reduction of about 50%.

The object of capacitor 45 was to minimize changes in output impedance of driver 10 as the polarity of the output pulses 18 change. Further improvement in reflection performance is provided by an RC network including capacitor 56 and resistor 58 connected from ground to the sending end of the transmission line 60 here depicted as coaxial cable. The value of the RC network is chosen to negate any changes in the output impedance of driver 10. Thus, the sending end of the transmission line 60 always sees 50 ohms independent of the driver operating conditions. By maintaining a nearly constant 50 ohm reverse termination, reflections are greatly reduced. A simulation of a typical embodiment showed the addition of a capacitor 56 of 2 picofarads in series with resistor 58 of 51 ohms reduced a reflection from 135 to 20 millivolts peak-to-peak.

In operation, capacitor 34 allows transistor 28 to provide positive transient drive for transistor 36, and transistor 26 to provide negative transient drive for transistor 38. Thus, amplifier 16 is driven more efficiently and hence, the switching speed is enhanced by capacitor 34. More specifically, capacitor 34 aids in overcoming the drawback of output transistors 36 and 38 not receiving equal input drive signals for both positive and negative going pulses because transistor 26 has better drive capability for negative going pulses, and transistor 28 has better drive capability for positive going pulses.

This concludes the description of the preferred embodiment. A reading of it by one skilled in the art will bring to mind many alterations and modifications that do not depart from the spirit and scope of the invention. Therefore, it is intended that the invention be limited only by the appended claims.

Typical component values for FIG. 2 are listed.

| | |
|---|---|
| current source 30 | 5 ma |
| current source 32 | 7 ma |
| capacitor 34 | 10 pf |
| resistor 40, 42 | 10 ohms |
| resistor 44 | 47 ohms |
| capacitor 45 | 10 pf |
| resistor 46 | 47 ohms |
| resistor 52 | 37.3 ohms |
| capacitor 56 | 2 pf |
| resistor 58 | 51 ohms |
| coaxial cable 60 | 50 ohms |
| capacitor 70a, 70b | 20 pf |

What is claimed is:

1. In a pin driver adapted for transmitting driver pulses of predetermined voltage levels and timing to a device under test, an output amplifier comprising:
   a complementary pair of transistors;
   a pair of resistors coupled in series between corresponding terminals of said complementary pair of transistors;
   an output terminal adapted for connecting a transmission line leading to said device under test;
   an output resistor coupled between said output terminal and a node between said pair of series resistors; and
   means for maintaining a substantially constant reverse termination impedance for said transmission line notwithstanding changes in output impedance at said corresponding terminals of said complementary pair of transistors.

2. The output amplifier recited in claim 1 wherein said maintaining means comprises a capacitor coupled between said corresponding terminals of said complementary pair of transistors.

3. The output amplifier recited in claim 1 further comprising a resistor and capacitor connected in series between said output terminal and ground.

4. The output amplifier recited in claim 1 wherein said corresponding terminals of said complementary pair of transistors are emitters.

5. The output amplifier recited in claim 4 wherein said complementary pair of transistors are emitter followers.

6. The output amplifier recited in claim 5 wherein one of said transistor is an npn type and the other is a pnp type.

7. The output amplifier recited in claim 5 further comprising means for driving bases of said complementary pair of transistors positive in response to a positive transition of an input pulse and negative in response to a negative transition of said input pulse.

8. In a pin driver adapted for transmitting driver pulses of predetermined voltage levels and timing to a device under test, an output amplifier comprising:
   a complementary pair of transistors;
   a pair of resistors coupled in series between corresponding terminals of said complementary pair of transistors;
   an output terminal adapted for connecting a transmission line leading to said device under test;
   an output resistor coupled between said output terminal and a node between said pair of series resistors; and
   means for maintaining a substantially constant reverse termination impedance for said transmission line notwithstanding changes in output impedance at said node, said maintaining means comprising a capacitor and resistor connected in series from said output terminal to ground.

9. In a pin driver adapted for transmitting driver pulses of predetermined voltage levels and timing to a device under test, an output amplifier comprising:
   a complementary pair of transistors;
   a pair of resistors connected in series between corresponding terminals of said complementary pair of transistors;
   an output terminal adapted for connecting a transmission line leading to said device under test;
   a resistor coupled between said output terminal and a node between said pair of series resistors; and
   a capacitor coupled between said corresponding terminals of said complementary pair of transistors.

10. The amplifier recited in claim 9 further comprising a capacitor and resistor connected in series between said output terminal and ground.

11. The amplifier recited in claim 9 wherein said corresponding terminals of said complementary pair of transistors are emitters.

12. The amplifier recited in claim 11 wherein said complementary pair of transistors are emitter followers.

13. In a pin driver adapted to transmit driver pulses of predetermined voltage levels and timing to a device under test wherein a pair of series resistors are connected between corresponding terminals of a complementary pair of transistors, and an output resistor is coupled from a node between said pair of series resistors to an output terminal adapted for connecting a transmission line leading to said device under test, a method of reducing driver pulse reflections comprising the step of:
   tieing the corresponding terminals of said complementary pair of transistors together with a capacitor to provide a substantially constant reverse termination impedance for said transmission line notwithstanding variations in output impedance of said corresponding terminals of said complementary pair of transistors.

14. The method recited in claim 13 further comprising a step of connecting a capacitor and resistor in series between said output terminal and ground.

15. A pin driver adapted for transmitting driver pulses of predetermined voltage levels and timing to a device under test, said pin driver comprising:
   pulse forming means responsive to a data input signal for providing a pulsed output of said predetermined voltage levels and timing in accordance with said data input signal;
   a buffer circuit comprising a pair of buffer transistors each having a base responsive to said pulsed output of said pulse forming means, said buffer circuit further comprising a pair of current sources each coupled to a respective one of corresponding terminals of said buffer transistors;
   a capacitor coupled between said corresponding terminals of said buffer transistors;
   an amplifier circuit comprising a complementary pair of transistors each having a base responsive to a respective one of said corresponding terminals of said buffer transistors;
   a pair of resistors connected in series between corresponding terminals of said amplifier transistors;
   an output terminal adapted for connecting a transmission line to transmit said driver pulses to said device under test; and
   an output resistor coupled between said output terminal and a node between said pair of series resistors.

16. The pin driver recited in claim 15 further comprising a capacitor coupled between said corresponding terminals of said amplifier transistors.

17. The pin driver recited in claim 15 further comprising a capacitor and resistor connected in series between said output terminal and ground.

18. The pin driver recited in claim 15 further comprising a pair of capacitors each coupled between ground and a respective one of second corresponding terminals of said amplifier transistors.

19. The pin driver recited in claim 15 wherein said corresponding terminals of said buffer and amplifier transistors are emitters.

20. The pin driver recited in claim 19 wherein said buffer and amplifier transistors are emitter followers.

* * * * *